(12) United States Patent
Camacho et al.

(10) Patent No.: US 8,652,881 B2
(45) Date of Patent: Feb. 18, 2014

(54) INTEGRATED CIRCUIT PACKAGE SYSTEM WITH ANTI-PEEL CONTACT PADS

(75) Inventors: Zigmund Ramirez Camacho, Singapore (SG); Jairus Legaspi Pisigan, Singapore (SG); Henry Descalzo Bathan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 351 days.

(21) Appl. No.: 12/235,288

(22) Filed: Sep. 22, 2008

(65) Prior Publication Data

US 2010/0072591 A1 Mar. 25, 2010

(51) Int. Cl.
*H01L 21/44* (2006.01)
*H01L 23/28* (2006.01)

(52) U.S. Cl.
USPC .................. 438/123; 257/676; 257/787

(58) Field of Classification Search
USPC .......... 257/782, 784, 786, 676, 787, E21.627, 257/E21.641, E23.015, E23.02, E21.499, 257/E23.043
See application file for complete search history.

(56) References Cited

U.S. PATENT DOCUMENTS

| | | | |
|---|---|---|---|
| 6,072,239 A | 6/2000 | Yoneda et al. | |
| 6,191,494 B1 | 2/2001 | Ooyama et al. | |
| 6,528,877 B2 | 3/2003 | Ernst et al. | |
| 6,635,957 B2 | 10/2003 | Kwan et al. | |
| 6,770,959 B2 | 8/2004 | Huang et al. | |
| 6,774,449 B1 | 8/2004 | Nishii et al. | |
| 2003/0080418 A1* | 5/2003 | Suwa et al. | 257/737 |
| 2005/0167855 A1* | 8/2005 | Minamio et al. | 257/787 |
| 2007/0187826 A1 | 8/2007 | Shim et al. | |
| 2007/0257348 A1 | 11/2007 | Yang | |
| 2009/0051051 A1* | 2/2009 | Tanaka | 257/787 |

* cited by examiner

*Primary Examiner* — Hoa B Trinh
(74) *Attorney, Agent, or Firm* — Ishimaru & Associates LLP

(57) ABSTRACT

An integrated circuit package system includes: forming an anti-peel pad having both a concave ring and an external terminal with the concave ring, having a peripheral wall, surrounding the external terminal; connecting an integrated circuit with the anti-peel pad; and forming an encapsulation over the integrated circuit, the concave ring, and the external terminal with the encapsulation under the peripheral wall.

20 Claims, 4 Drawing Sheets

US 8,652,881 B2

INTEGRATED CIRCUIT PACKAGE SYSTEM WITH ANTI-PEEL CONTACT PADS

TECHNICAL FIELD

The present invention relates generally to an integrated circuit package system and more particularly to an integrated circuit package system with a pad.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body to provide a path for signal transfer between the die and external devices. Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

Different challenges arise from increased functionality integration and miniaturization. For example, a semiconductor product having increased functionality may be made smaller but may still be required to provide a large number of inputs/outputs (I/O). The size reduction increases the I/O density or decreases the I/O pitch for the integrated circuit package and its respective integrated circuit carriers.

The ever-increasing I/O density trend presents a myriad of manufacturing problems. Some of these problems reside in integrated circuit manufacturing realm, such as fine pitch connections and reliability of these connections. Others problems involve mounting these increase I/O density integrated circuits on carriers for packaging. Yet other problems involve reliability of the thin, high-density I/O package. These and other obstacles must be overcome to deliver extremely small packages with thinner and thinner profile in high volume while providing connectivity to a large number of I/O.

Thus, a need still remains for an integrated circuit package system providing low cost manufacturing, improved yield, improved reliability, and high-density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes forming an anti-peel pad having both a concave ring and an external terminal with the concave ring, having a peripheral wall, surrounding the external terminal; connecting an integrated circuit with the anti-peel pad; and forming an encapsulation over the integrated circuit, the concave ring, and the external terminal with the encapsulation under the peripheral wall.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
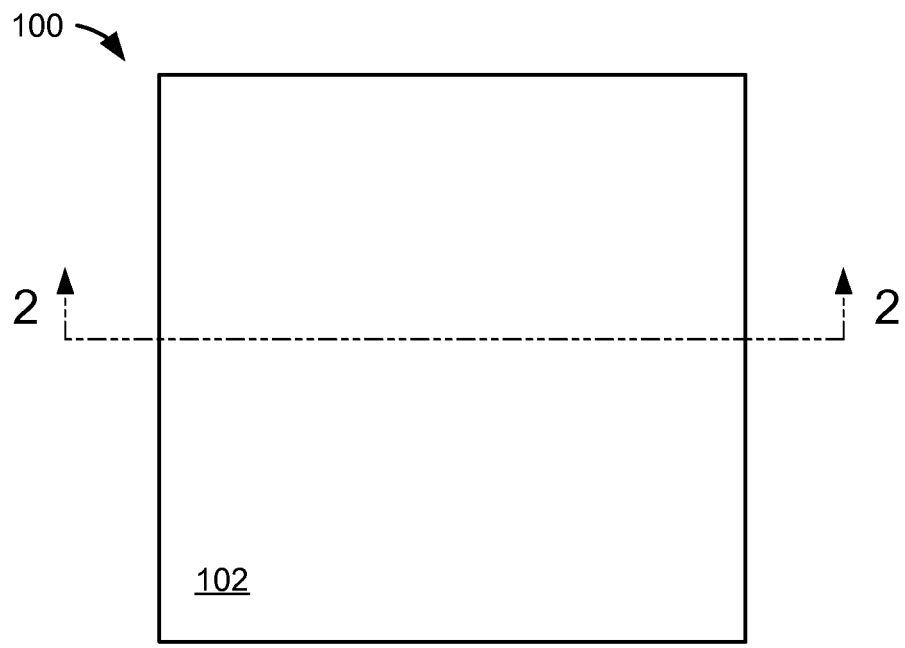
FIG. 1 is a top view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in an embodiment of the present invention. The top view depicts an encapsulation 102, such as a cover with an epoxy molding compound.

Figure 2:
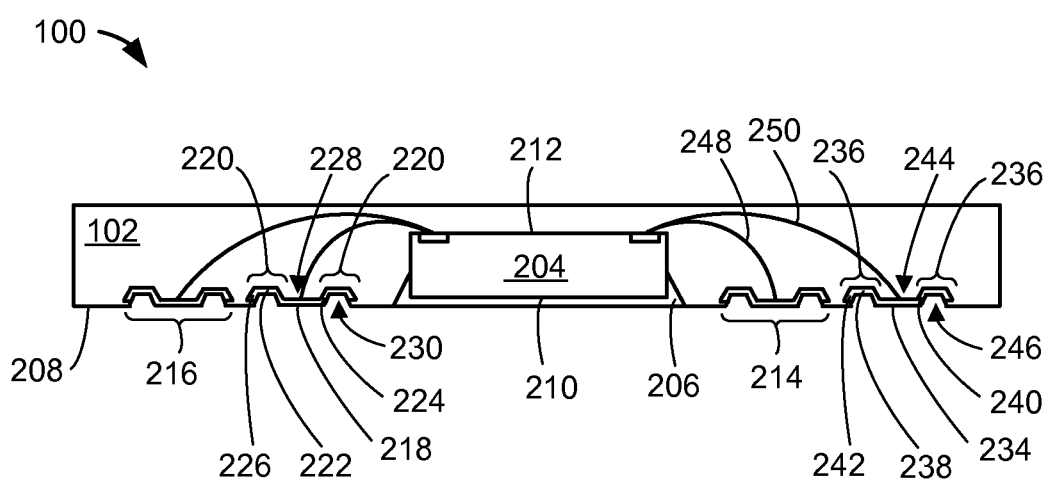
FIG. 2 is a cross-sectional view of the integrated circuit package system along line 2-2 of FIG. 1.

For illustrative purposes, the integrated circuit package system 100 is shown in a square geometric configuration, although it is understood that the integrated circuit package system 100 can be formed in a different geometric configuration. For example, the integrated circuit package system 100 can have a rectangular configuration Referring now to FIG. 2, therein is shown a cross-sectional view of the integrated circuit package system 100 along line 2-2 of FIG. 1. The cross-sectional view depicts an integrated circuit 204, such as an integrated circuit die, over an adhesive 206, such as a die-attach adhesive. The adhesive 206 can be exposed by a bottom side 208 of the encapsulation 102. The integrated circuit 204 includes a non-active side 210 and an active side 212. The active side 212 includes active circuitry fabricated thereon. The non-active side 210 faces the bottom side 208 of the encapsulation 102.

The integrated circuit package system 100 includes first anti-peel pads 214, such as locking plated bumps, and second anti-peel pads 216, such as locking plated bumps. The first anti-peel pads 214 can be between the second anti-peel pads 216 and the integrated circuit 204.

Each of the first anti-peel pads 214 includes a first external terminal 218 surrounded by a first concave ring 220. The first concave ring 220 includes a first interior portion 222, a first inner wall 224, and a first peripheral wall 226. The first inner wall 224 can be between the first interior portion 222 and the first external terminal 218. The first inner wall 224 can be integral with the first external terminal 218 and the first interior portion 222. The first interior portion 222 can have the first peripheral wall 226 integrally connected opposite the first inner wall 224. The first inner wall 224 and the first external terminal 218 can form a first inner recess 228 facing the encapsulation 102. The first external terminal 218 can be coplanar with the bottom side 208 of the encapsulation 102 for connection to the next system level (not shown), such as a printed circuit board or another integrated circuit package system.

The first peripheral wall 226 does not extend to the bottom side 208 of the encapsulation 102. The encapsulation 102 is under the first peripheral wall 226 providing a molding locking feature of the first anti-peel pads 214. The first peripheral wall 226, the first inner wall 224, and the first interior portion 222 can form a first outer recess 230 facing away from the encapsulation 102.

For illustrative purposes, the integrated circuit package system 100 is shown with the first anti-peel pads 214 having both the first inner wall 224 and the first peripheral wall 226 in a sloped configuration, although it is understood that the integrated circuit package system 100 can have a different configuration for the first anti-peel pads 214. For example, the first inner wall 224, the first peripheral wall 226, or a combination thereof can have a vertical slope, sloped in the opposite direction, or a combination thereof.

Each of the second anti-peel pads 216 includes a second external terminal 234 surrounded by a second concave ring 236. The second concave ring 236 includes a second interior portion 238, a second inner wall 240, and a second peripheral wall 242. The second inner wall 240 can be between the second interior portion 238 and the second external terminal 234. The second inner wall 240 and the second external terminal 234 can form a second inner recess 244 facing the encapsulation 102. The second external terminal 234 can be coplanar with the bottom side 208 of the encapsulation 102 for connection to the next system level (not shown), such as a printed circuit board or another integrated circuit package system.

The second peripheral wall 242 does not extend to the bottom side 208 of the encapsulation 102. The encapsulation 102 is under the second peripheral wall 242 providing a molding locking feature of the second anti-peel pads 216. The second peripheral wall 242, the second inner wall 240, and the second interior portion 238 can form a second outer recess 246 facing away from the encapsulation 102.

For illustrative purposes, the integrated circuit package system 100 is shown with the second anti-peel pads 216 having both the second inner wall 240 and the second peripheral wall 242 in a sloped configuration, although it is understood that the integrated circuit package system 100 can have a different configuration for the second anti-peel pads 216. For example, the second inner wall 240, the second peripheral wall 242, or a combination thereof can have a vertical slope, sloped in the opposite direction, or a combination thereof.

It has been discovered that the present invention provides an integrated circuit package system with improved reliability with the anti-peel pads. The peripheral wall of the anti-peel pads functions as mold locks with the encapsulation under the peripheral wall secures the anti-peel pads in the encapsulation. This keeps the anti-peel pads from separating from the encapsulation.

First internal interconnects 248, such as bond wires, ribbon bond wires, or reverse standoff stitch bonding (RSSB), can be between the integrated circuit 204 and the first anti-peel pads 214 within the first inner recess 228. Second internal interconnects 250, such as bond wires, ribbon bond wires, or reverse standoff stitch bonding (RSSB), can be between the integrated circuit 204 and the second anti-peel pads 216 within the second inner recess 244.

The encapsulation 102 can cover the integrated circuit 204, the first internal interconnects 248, and the second internal interconnects 250. The encapsulation 102 can fill the first inner recess 228 and the second inner recess 244 forming the first anti-peel pads 214, the second anti-peel pads 216 respectively, as molding locking plated bumps. The first external terminal 218 and the second external terminal 234 are exposed by the encapsulation 102.

For illustrative purposes, the integrated circuit package system 100 is shown with the first anti-peel pads 214 and the second anti-peel pads 216 exposed for connection to the next system level (not shown), although it is understood that the integrated circuit package system 100 can have a different configuration to connect to the next system level. For example, the integrated circuit package system 100 can include conductive bumps or balls (not shown), such as solder bumps or solder balls, attached to the first anti-peel pads 214, the second anti-peel pads 216, or a combination thereof.

Also for illustrative purposes, the integrated circuit package system 100 is shown with the adhesive 206 exposed from the bottom side 208 of the encapsulation 102, although it is understood that the integrated circuit package system 100 can have a different configuration. For example, the integrated circuit package system 100 can have the integrated circuit 204 mounted over an anti-peel paddle (not shown), such as a die-attach paddle, with the adhesive 206. The anti-peel paddle can be structurally similar to the first anti-peel pads 214 and the second ant-peel pads 216. The anti-peel paddle can be exposed at the bottom side 208 of the encapsulation 102.

Figure 3:
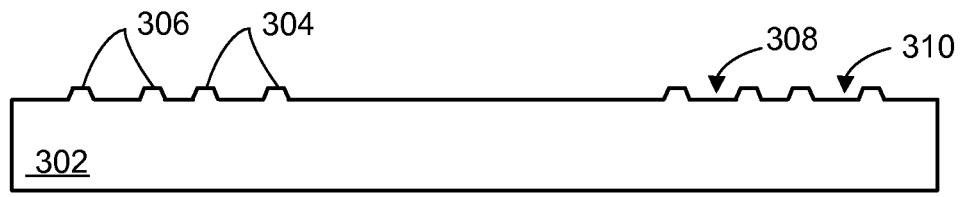
FIG. 3 is a cross-sectional view of a portion of a manufacturing carrier.

Referring now to FIG. 3, therein is shown a cross-sectional view of a portion of a manufacturing carrier 302. The manufacturing carrier 302, such as copper carrier, includes first protruding rings 304 and second protruding rings 306. The first protruding rings 304 can be adjacent to one another. The second protruding rings 306 can be separated from each other with the first protruding rings 304 in between. The manufacturing carrier 302 can serve as a support member or a plating current path that can be used in electroplating process. Each of the first protruding rings 304 can form a first cavity 308 therein. Each of the second protruding rings 306 can form a second cavity 310 therein.

Figure 4:
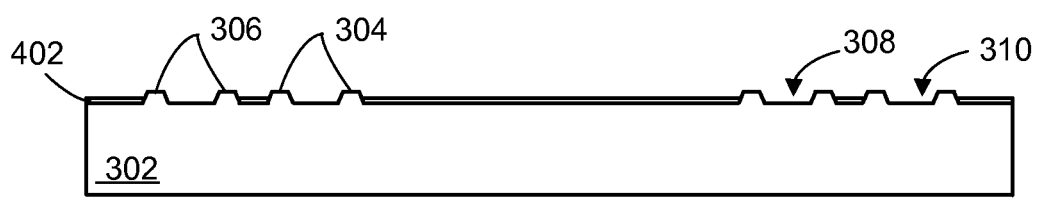
FIG. 4 is the structure of FIG. 3 in forming a mask.

Referring now to FIG. 4, therein is shown the structure of FIG. 3 in forming a mask 402. The mask 402 can be formed over a predetermined portion of the manufacturing carrier 302. The mask 402 can cover the top side of the manufacturing carrier 302 and can expose the first cavity 308 and the second cavity 310. The mask 402 can also expose the first protruding rings 304 and the second protruding rings 306.

Figure 5:
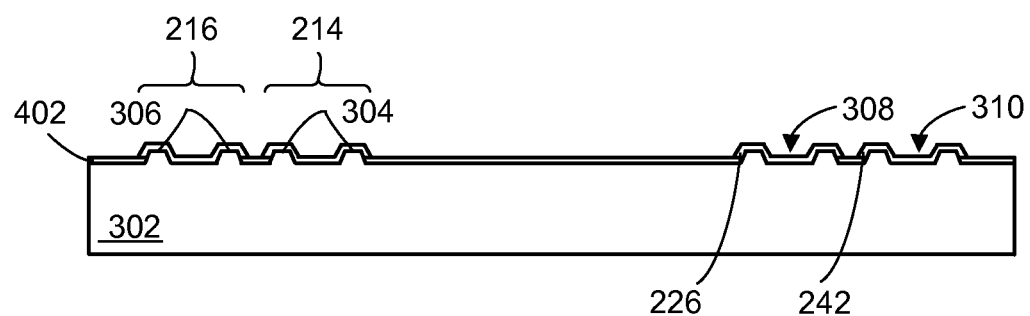
FIG. 5 is the structure of FIG. 4 in forming the first anti-peel pads and the second anti-peel pads.

Referring now to FIG. 5, therein is shown the structure of FIG. 4 in forming the first anti-peel pads 214 and the second anti-peel pads 216. The first anti-peel pads 214 and the second anti-peel pads 216 can be formed by a number of different processes.

For example, the manufacturing carrier 302 can undergo controlled electroplating forming the first anti-peel pads 214 over the first cavity 308 and the first protruding rings 304. The second anti-peel pads 216 can be formed over the second cavity 310 and the second protruding rings 306.

The mask 402 can prevent conductive structures from forming over the manufacturing carrier 302 covered by the mask 402. The first peripheral wall 226 of the first anti-peel pads 214 are over the mask 402 or overhanging the mask 402. The second peripheral wall 242 of the second anti-peel pads 216 are over the mask 402 or overhanging the mask 402.

Figure 6:
FIG. 6 is the structure of FIG. 5 in removal of the mask of FIG. 5.

Referring now to FIG. 6, therein is shown the structure of FIG. 5 in removal of the mask 402 of FIG. 5. The mask 402 can be removed by chemical removal leaving the first anti-peel pads 214 and the second anti-peel pads 216. The top side of the manufacturing carrier 302 is exposed with the first peripheral wall 226 forming a first overhang 602 over the manufacturing carrier 302 and the first external terminal 218. The second peripheral wall 242 can also form a second overhang 604 over the manufacturing carrier 302 and the second external terminal 234.

Figure 7:
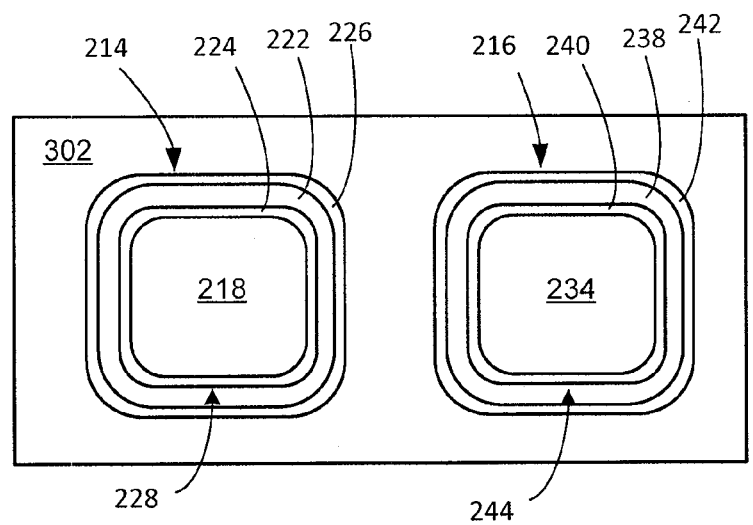
FIG. 7 is a top view of the one of the first anti-peel pads and one of the second anti-peel pads over the manufacturing carrier.

Referring now to FIG. 7, therein is shown a top view of the one of the first anti-peel pads 214 and one of the second anti-peel pads 216 over the manufacturing carrier 302. The top view depicts the first external terminal 218 in the first inner recess 228. The first external terminal 218 is adjacent to the first inner wall 224. The first inner wall 224 continues to the first interior portion 222. The first interior portion 222 continues to the first peripheral wall 226.

The top view also depicts the second external terminal 234 in the second inner recess 244. The second external terminal 234 is adjacent to the second inner wall 240. The second inner wall 240 continues to the second interior portion 238. The second interior portion 238 continues to the second peripheral wall 242.

Figure 8:
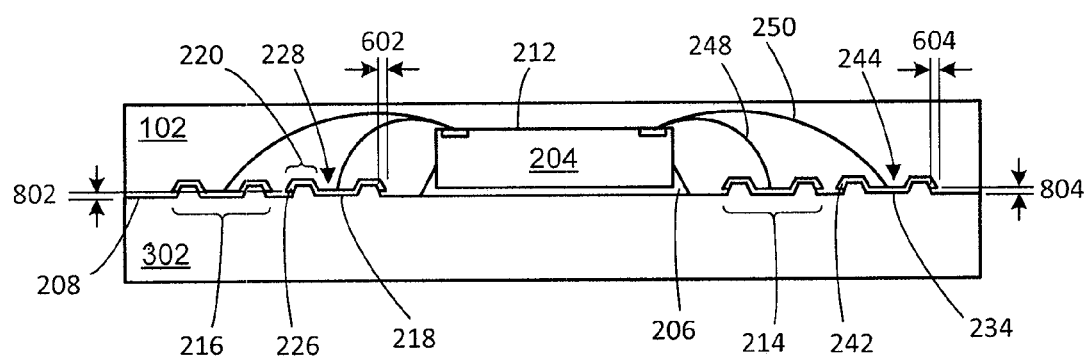
FIG. 8 is the structure of FIG. 6 in forming the encapsulation.

Referring now to FIG. 8, therein is shown the structure of FIG. 6 in forming the encapsulation 102. The integrated circuit 204 can be attached to the manufacturing carrier 302 with the adhesive 206. The first internal interconnects 248 can connect the active side 212 of the integrated circuit 204 and the first anti-peel pads 214 in the first inner recess 228. The second internal interconnects 250 can connect the active side 212 of the integrated circuit 204 and the second anti-peel pads 216 in the second inner recess 244.

The encapsulation 102 can be formed over the manufacturing carrier 302 covering the integrated circuit 204, the first internal interconnects 248, the second internal interconnects 250, the first anti-peel pads 214, and the second anti-peel pads 216. The encapsulation 102 fills the first inner recess 228 and the second inner recess 244.

The encapsulation 102 fills the gap between the manufacturing carrier 302 and the first overhang 602 of the first peripheral wall 226 of the first concave ring 220 forming the mold lock of the first anti-peel pads 214. The first overhang 602 has a first overhang height 802 above the bottom side 208 of the encapsulation 102. The first external terminal 218 can be coplanar with the bottom side 208. The first concave ring 220 is spaced away from the bottom side 208 of the encapsulation 102 by the first overhang height 802.

The encapsulation 102 also fills the gap between the manufacturing carrier 302 and the second overhang 604 of the second peripheral wall 242 forming the mold lock of the second anti-peel pads 216. The second overhang 604 has a second overhang height 804 above the bottom side 208 of the encapsulation 102. The second external terminal 234 can be coplanar with the bottom side 208.

The structure having the encapsulation 102 can undergo a removal process to remove the manufacturing carrier 302. The manufacturing carrier 302 can be removed by an etching process forming the integrated circuit package system 100 of FIG. 2.

Figure 9:
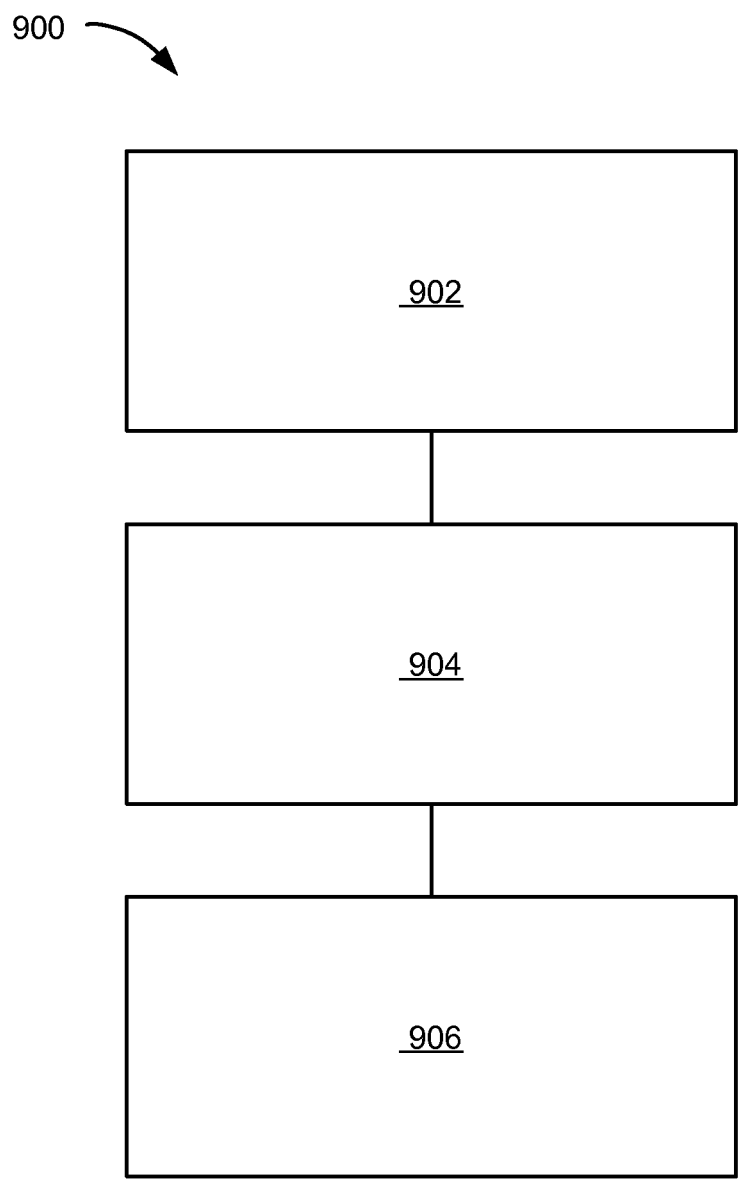
FIG. 9 is a flow chart of an integrated circuit package system for manufacture of the integrated circuit package system in an embodiment of the present invention.

Referring now to FIG. 9, therein is shown a flow chart of an integrated circuit package system 900 for manufacture of the integrated circuit package system 100 in an embodiment of the present invention. The system 900 includes forming an anti-peel pad having both a concave ring and an external terminal with the concave ring, having a peripheral wall, surrounding the external terminal in a block 902; connecting an integrated circuit with the anti-peel pad in a block 904; and forming an encapsulation over the integrated circuit, the concave ring, and the external terminal with encapsulation under the peripheral wall in a block 906.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacture of an integrated circuit package system comprising:
    forming an anti-peel pad having both a concave ring and an external terminal with the concave ring surrounding the external terminal and having an inner wall integral with the external terminal and opposite a peripheral wall;
    connecting an integrated circuit with the anti-peel pad; and
    forming an encapsulation over the integrated circuit, the concave ring, and the external terminal, the concave ring spaced away from a bottom side of the encapsulation by an overhang height.

2. The method as claimed in claim 1 wherein:
    forming the anti-peel pad includes forming an inner recess bounded by the inner wall of the concave ring and the external terminal; and
    forming the encapsulation includes filling the inner recess.

3. The method as claimed in claim 1 wherein forming the anti-peel pad having both the concave ring and the external terminal includes forming the concave ring having an interior portion adjacent to the peripheral wall and the external terminal.

4. The method as claimed in claim 1 wherein connecting the integrated circuit and the anti-peel pad includes connecting the integrated circuit and the external terminal.

5. The method as claimed in claim 1 wherein forming the encapsulation includes exposing the external terminal.

6. A method for manufacture of an integrated circuit package system comprising:
    forming a protrusion ring from a manufacturing carrier;
    forming a mask over the manufacturing carrier with an interior of the protrusion ring exposed;
    forming an anti-peel pad over the protrusion ring and over the mask with the anti-peel pad having both a concave ring and the external terminal, and the concave ring having a peripheral wall and surrounding the external terminal;
    removing the mask with the peripheral wall overhanging the manufacturing carrier;
    connecting an integrated circuit with the external terminal;
    forming an encapsulation over the integrated circuit, the concave ring, and the external terminal with the external terminal exposed from the encapsulation, terminal, the concave ring spaced away from a bottom side of the encapsulation by an overhang height; and
    removing the manufacturing carrier with the anti-peel pad and the encapsulation exposed.

7. The method as claimed in claim 6 wherein forming the encapsulation over the integrated circuit, the concave ring, and the external terminal with the encapsulation under the peripheral wall of the concave ring includes forming the peripheral wall having the overhang height above the bottom side of the encapsulation.

8. The method as claimed in claim 6 wherein:
    forming the anti-peel pad having both the concave ring and the external terminal includes forming the concave ring having an interior portion adjacent to the peripheral wall and the external terminal; and
    forming an outer recess bounded by the peripheral wall and the interior portion.

9. The method as claimed in claim 6 wherein forming the encapsulation includes forming the bottom side of the encapsulation coplanar with the external terminal of the anti-peel pad.

10. The method as claimed in claim 6 wherein forming the anti-peel pad having both the concave ring and the external terminal includes forming the concave ring having the peripheral wall with the overhang height above the external terminal.

11. An integrated circuit package system comprising:
    an anti-peel pad having both a concave ring and an external terminal with the concave ring, surrounding the external terminal and having an inner wall integral with the external terminal and opposite a peripheral wall;
    an integrated circuit connected to the anti-peel pad; and
    an encapsulation over the integrated circuit, the concave ring, and the external terminal, the concave ring spaced away from the bottom side of the encapsulation by an overhang height.

12. The system as claimed in claim 11 wherein the anti-peel pad includes an inner recess, bounded by the inner wall of the concave ring and the external terminal, and filled with the encapsulation.

13. The system as claimed in claim 11 wherein the anti-peel pad having both the concave ring and the external terminal includes the concave ring having an interior portion adjacent to the peripheral wall and the external terminal.

14. The system as claimed in claim 11 wherein the integrated circuit connected to the anti-peel pad includes the integrated circuit connected to the external terminal.

15. The system as claimed in claim 11 wherein the external terminal exposed from the encapsulation.

16. The system as claimed in claim 11 wherein:
    the integrated circuit connected to the external terminal; and
    the external terminal exposed from the encapsulation.

17. The system as claimed in claim 16 wherein the peripheral wall includes the overhang height above the bottom side of the encapsulation.

18. The system as claimed in claim 16 wherein the concave ring includes an interior portion adjacent to the peripheral wall and the external terminal with an outer recess bounded by the peripheral wall and the interior portion.

19. The system as claimed in claim 16 wherein the encapsulation includes the bottom side coplanar with the external terminal of the anti-peel pad.

20. The system as claimed in claim 16 wherein the peripheral wall includes the overhang height above the external terminal.

\* \* \* \* \*